US005612242A

United States Patent [19]

Hsu

[11] Patent Number: 5,612,242
[45] Date of Patent: Mar. 18, 1997

[54] TRENCH ISOLATION METHOD FOR CMOS TRANSISTOR

[75] Inventor: Chen-Chung Hsu, Taichung, Taiwan

[73] Assignee: United Microelectronics Corp., Hsinchu, Taiwan

[21] Appl. No.: 613,517

[22] Filed: Mar. 11, 1996

[51] Int. Cl.[6] .................................................. H01L 21/70
[52] U.S. Cl. .............................. 437/56; 437/34; 437/57; 437/58; 437/63; 437/38; 437/67; 437/228; 437/41
[58] Field of Search ............................... 437/34, 56, 57, 437/58, 63, 67, 38, 228, 41 REM

[56] References Cited

U.S. PATENT DOCUMENTS

| 4,729,964 | 3/1988 | Natsuaki et al. | 437/56 |
| 4,927,777 | 5/1990 | Hsu et al. | 437/34 |
| 4,980,306 | 12/1990 | Shimbo | 437/63 |
| 5,525,532 | 6/1996 | Kim | 437/57 |

FOREIGN PATENT DOCUMENTS

| 0244043 | 12/1985 | Japan | 437/63 |
| 0244044 | 12/1985 | Japan | 437/63 |
| 0206850 | 9/1987 | Japan | 437/34 |

*Primary Examiner*—John Niebling
*Assistant Examiner*—Long Pham
*Attorney, Agent, or Firm*—Law Offices of Steven M. Rabin, P.C.

[57] ABSTRACT

A method of performing trench isolation in a CMOS transistor, that produces no latch-up and results in an effective isolating structure without using an epitaxial growth process. A field oxide layer is provided on a silicon substrate to isolate an active region. A first conductivity-type well is formed at a predetermined position of the active region. A gate oxide layer, a polysilicon layer and a silicide layer are deposited in sequence. A first gate electrode and a second gate electrode are formed by lithography and etching techniques wherein the first gate electrode is on the well, and the second gate electrode is on the active region outside the well. A silicon nitride layer is deposited and etched back to form spacers on the side walls of the electrodes whereby slits are left between the field oxide layer and the spacers and between adjacent spacers. Trenches are formed by etching the silicon substrate in the slits. An oxide layer is formed to refill the trenches and then etched back to remove the spacers. The well is implanted with impurities of a second conductivity-type to provide second conductivity-type source-drain electrodes by using the first gate electrode as a mask. The active region outside the well is implanted with first conductivity-type impurities to provide first conductivity-type source-drain electrodes, and the process of trench isolation of CMOS transistor is completed.

18 Claims, 5 Drawing Sheets

5,612,242

TRENCH ISOLATION METHOD FOR CMOS TRANSISTOR

BACKGROUND OF THE INVENTION

1. Field of the Invention

This invention relates in general to a method of trench isolation in the manufacture of a CMOS transistor, and more particularly to a method of trench isolation which prevents latch-up of the CMOS transistor without using an epitaxial growth process.

2. Description of the Related Art

All CMOS circuits have a problem of latch-up which is induced by parasitic transistors. As shown in FIG. 1, a CMOS circuit consists of an NMOS transistor 21 formed in a P-type silicon substrate 10 and a PMOS transistor 19 formed in an N-well 11. In such a CMOS circuit, a parasitic bipolar transistor is easily formed. For example, within the PMOS transistor 19, a vertical PNP bipolar transistor is formed by the $P^+$ drain-source (emitter), N-well 11 (base) and P-type silicon substrate 10 (collector). Similarly, within the NMOS transistor 21, a lateral NPN bipolar transistor is formed by the $N^+$ drain-source (emitter), P-type substrate 10 (base) and N-well 11 (collector).

The vertical PNP bipolar transistor and the lateral NPN bipolar transistor are mutually coupled so that a thyristor is formed. If the current gain product of these two transistors is larger than 1, a large current will flow into the source from the drain whereby latch-up of the CMOS circuit is induced which causes temporary or permanent malfunctioning of the CMOS circuit A method of preventing latch-up of a CMOS circuit is to enlarge the distance between the N-well and the $N^+$ source-drain electrodes of the NMOS transistor, but this approach reduces the degree of integration of this integrated circuit component. Thus, the method popularly adapted to resolve the latch-up problem is an epitaxial process which is shown in FIGS. 2A through 2E.

As shown in FIG. 2A, an oxide layer 12 is deposited on a silicon substrate 10. Trenches 14, 16 are formed by etching predetermined positions of the substrate 10 such as where an N-well 11 and a field oxide layer 15 will be formed (see FIGS. 2C and 2D). In FIG. 2B, an insulating layer 18 is formed on the side walls of trenches 14 and 16 and N-type impurities such as phosphorus are implanted in the bottom of the trench 14, so that the silicon substrate beneath the trench 14 becomes heavily doped with N-type impurities.

As shown in FIG. 2C, trenches 14 and 16 are refilled by epitaxial growth. Under the trench 14, since the silicon substrate 10 is heavily doped with N-type impurities, the epitaxial silicon layer within the trench 14 provides the N-well 11. Under the trench 16, the silicon substrate is P-type. The epitaxial silicon layer within the trench 16 provides a channel-stop 13. As shown in FIG. 2D, then a field oxide layer 15 is formed. As shown in FIG. 2E, a PMOS transistor then is provided inside the N-well 11 and an NMOS transistor is provided in the P-type substrate. The oxide layer 18 is used for isolation.

Although the above mentioned method has the effect of preventing latch-up, it still has the following two deficiencies:

1. The epitaxial growth process is not easily performed in mass production.
2. The epitaxial growth rate is not easy to control.

SUMMARY OF THE INVENTION

It is therefore an object of the invention to provide an effective and practical method of providing trench isolation during mass production of CMOS transistors.

It is another object of the invention to provide a method of providing trench isolation in a CMOS transistor, that does not use an epitaxial growth process, but still results in the same structure as would be obtained using epitaxial growth.

It is another object of the invention to provide a method of producing a CMOS circuit that does not suffer from "latch-up" or parasitic bipolar transistor effects.

The invention achieves the above-identified objects by providing a new method of producing trench isolation in a CMOS transistor on a substrate. The method contains the following steps: A field oxide layer is formed on a first conductivity-type silicon substrate to isolate an active region. A second conductivity-type N-well is formed at a predetermined position in the active region. A gate oxide layer, a polysilicon layer and a silicide layer are deposited in sequence. Then a first gate electrode and a second gate electrode are formed by lithography and etching techniques, wherein the first gate electrode is on the well, and the second gate electrode is on the active region outside of the well. By depositing an insulating layer and etching back, spacers are formed on the side walls of the first gate electrode and the second gate electrode. Moreover, slits are left between the field oxide layer and spacers adjacent thereto and between mutually adjacent spacers. Trenches are formed by etching the silicon substrate in these slits. A oxide layer is formed to refill the trenches and then etched back to removed the spacers. The well is implanted with impurities of the first conductivity-type to provide a first conductivity-type source-drain electrode, by using the first gate electrode as a mask. The active region outside the well is implanted with impurities of the second conductivity-type to provide second source-drain electrodes, whereby the process of providing trench isolation in a CMOS transistor is completed.

BRIEF DESCRIPTION OF THE DRAWINGS

Other objects, features, and advantages of the invention will become apparent by way of the following detailed description of the preferred but non-limiting embodiment. The description is made with reference to the accompanying drawings in which.

DESCRIPTION OF THE PREFERRED EMBODIMENT

1. Defining an active region and completing the formation of a well

Figure 1:
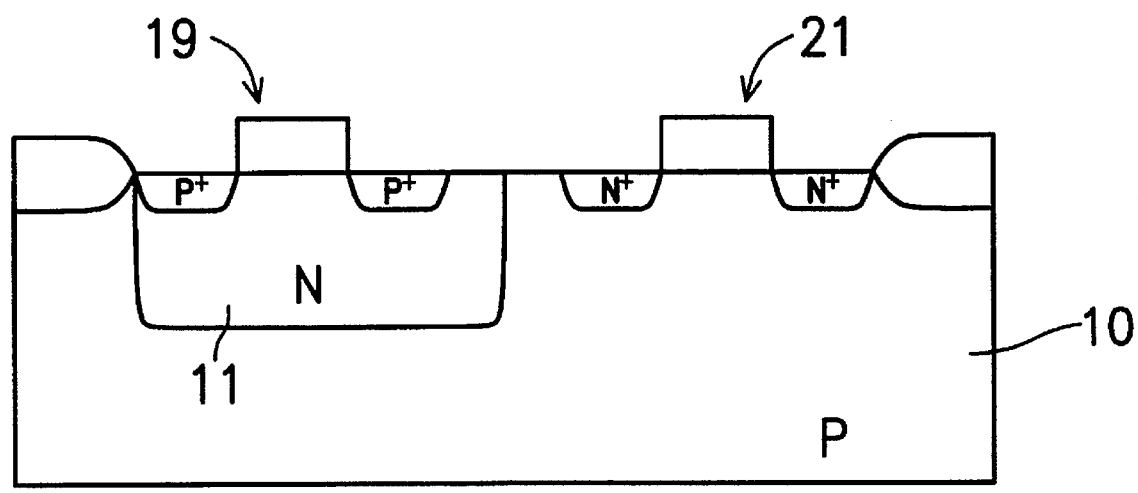
FIG. 1 is a schematic diagram illustrating the conventional structure of a CMOS component.
Figure 2A:
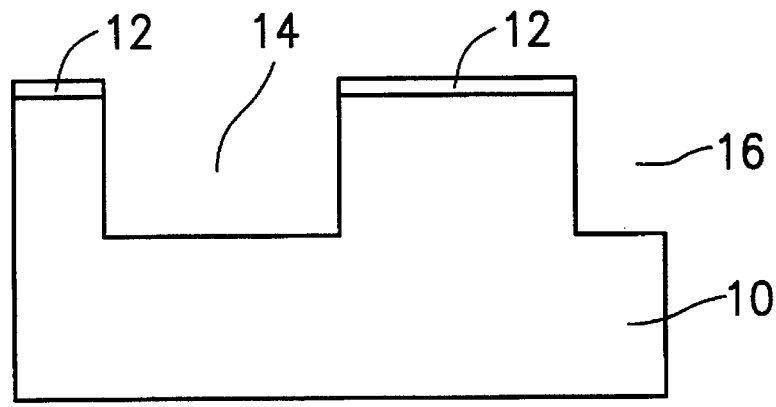
FIGS. 2A through 2E are schematic diagrams illustrating a structure of a CMOS component and a process of forming the same using epitaxial growth.
Figure 2B:
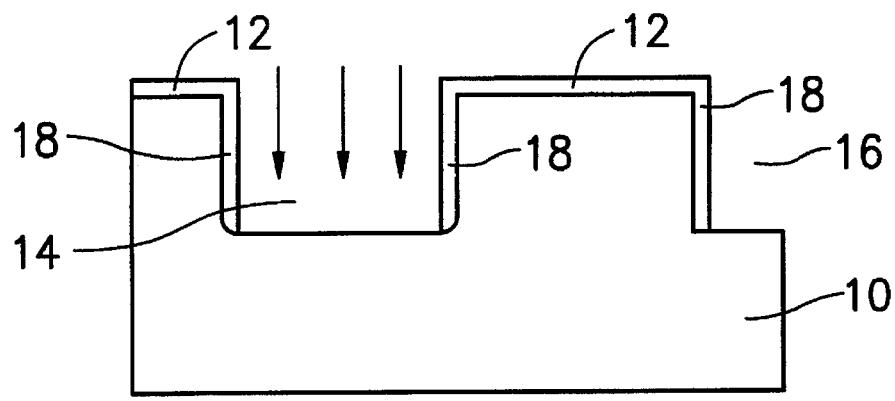
Figure 2C:
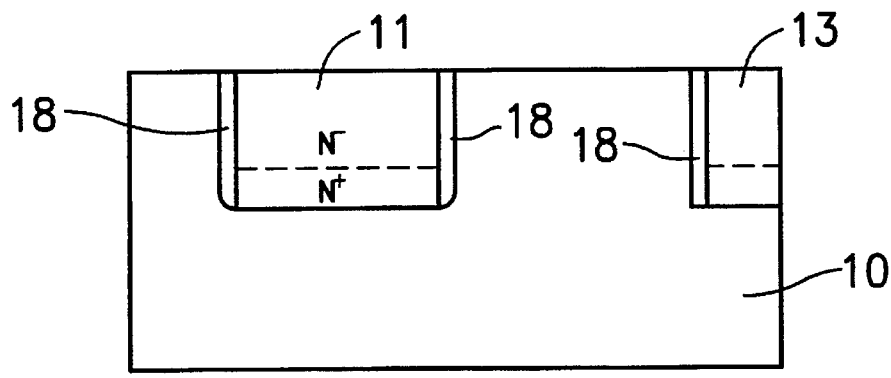
Figure 2D:
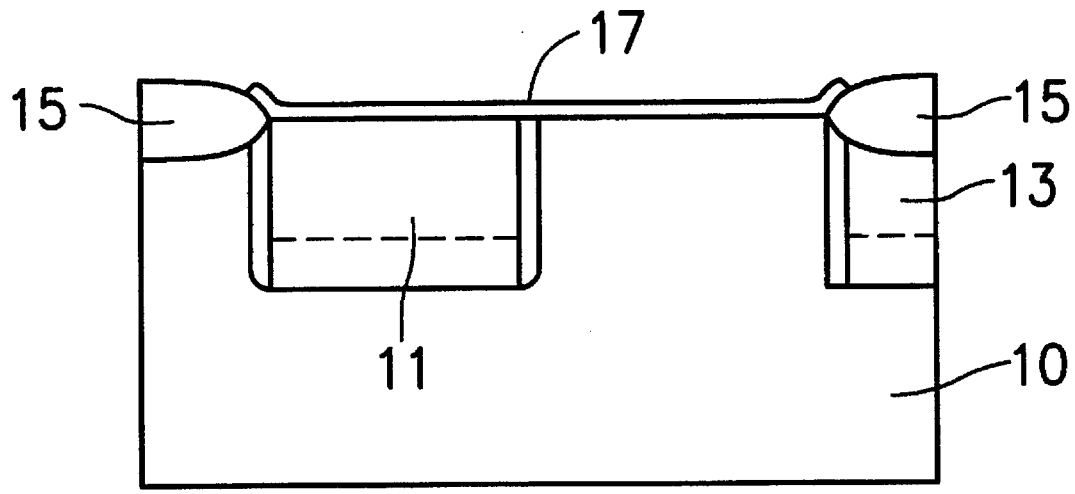
Figure 2E:
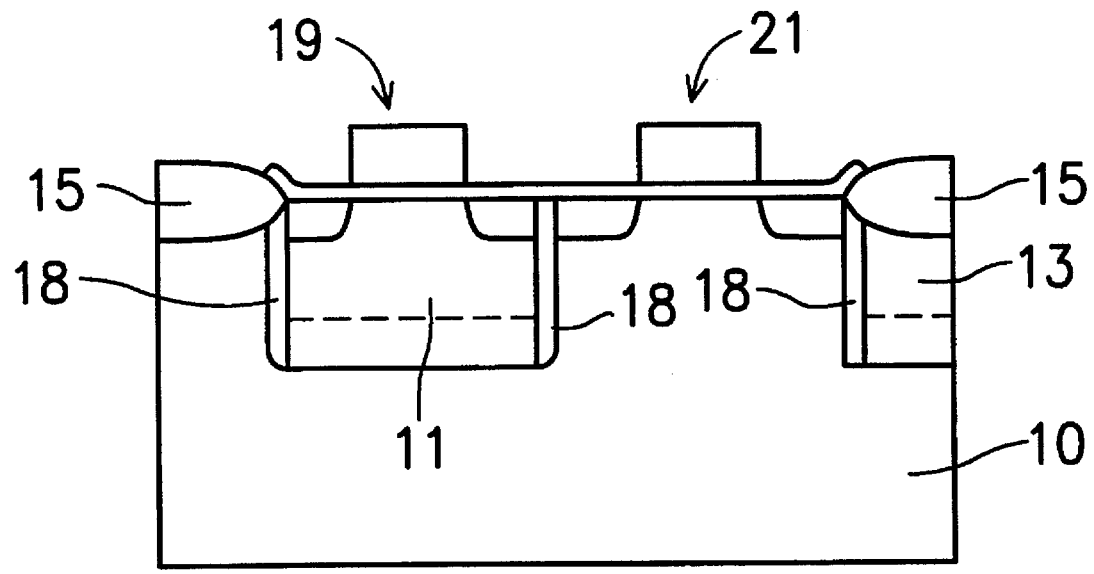
Figure 3A:
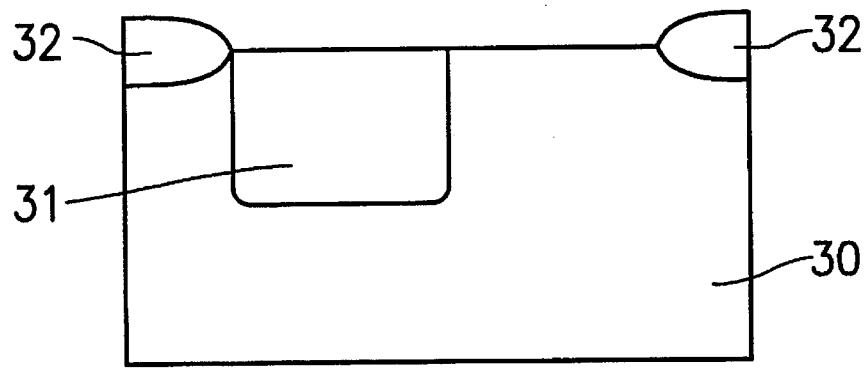
FIGS. 3A through 3F are schematic diagrams illustrating the process of CMOS transistor manufacture according to the invention.

Referring to FIG. 3A, on a silicon substrate a field oxide layer 32 is formed to isolate a defined active region and to form a well at a predetermined position. For example, on a P-type silicon substrate 30, a predetermined position defined by photoresist is implanted with N-type impurities using thermal diffusion, whereby an N-well 31 is formed.

2. Forming a gate electrode of CMOS and depositing an insulating layer

Figure 3B:
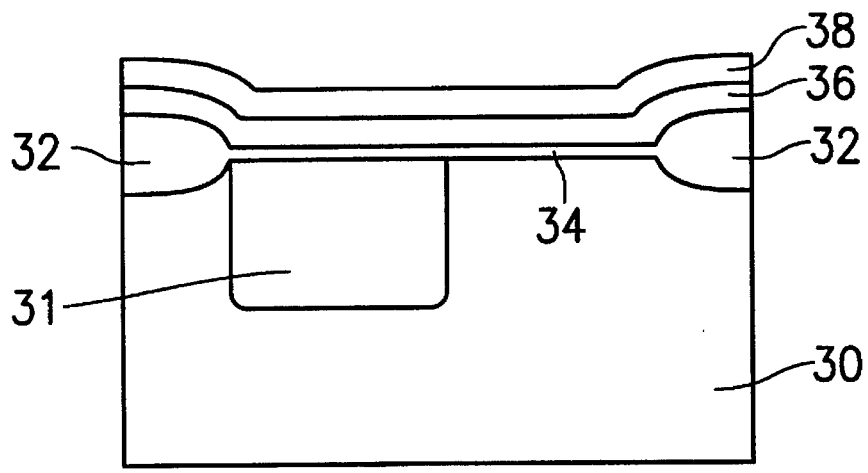
Figure 3C:
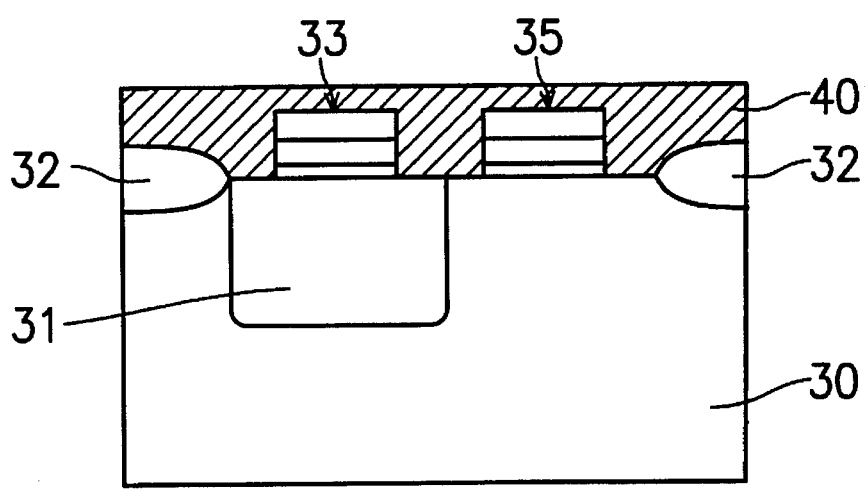

Referring to FIGS. 3B and 3C, after adjusting a threshold voltage by implanting impurities, a gate oxide layer 34, a polysilicon layer 36 and a silicide layer 38 are deposited in sequence. For example, the gate oxide layer 34 is formed on the substrate 30 to a thickness of between about 100 to 250 Å. in the active region by using oxidation. A polysilicon layer 36 is deposited to a thickness of between about 2000 Å to 3000 Å by using low-pressure chemical vapor deposition (LPCVD), and is heavily doped with N-type impurities by thermal diffusion or implantation. Then a tungsten silicide layer (WSi$_x$) 38 is deposited thereon Next, after defining the pattern of CMOS gate electrodes by a lithographic technique and dry etching, the gate electrodes 33 and 35 are formed and in the meantime their resistivity is reduce by annealing. Finally, an insulating layer 40 such as a silicon nitride layer is deposited.

3. Forming spacers and etching trenches

Figure 3D:
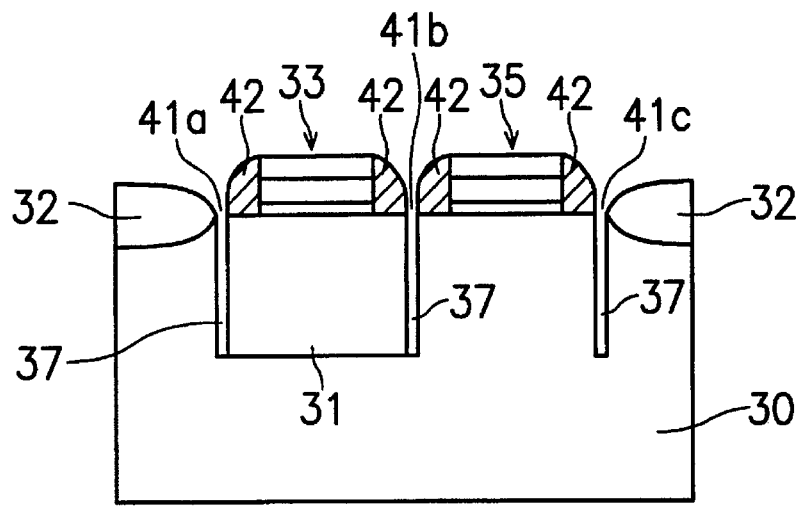

Referring to FIG. 3D, the silicon nitride layer 40 is etched back whereby spacers 42 are formed, each to a length of about 1 to 3 μm, on the side walls of the gate electrodes 33 and 35, slits 41a and 41c are left at the margin between the field oxide layer 32 and the spacers 42 adjacent thereto at the outer sides of the gate electrodes 33 and 35, and slit 41b is left between the mutually adjacent spacers 42 at the inner opposing sides of the gate electrodes 33 and 35. Using the field oxide layer 32, the spacers 42 and the gate electrodes 33, 35 as masks, trenches 37 are formed by anisotropic dry etching to a depth of about 2 to 4 μm in the slits 41a, 41c between the field oxide layer 32 and the outer spacers 42, and in the slit 41b between adjacent inner spacers 42 on the edge of the active region adjacent to the well 31.

4. Refilling trenches and subsequent processes

Figure 3E:
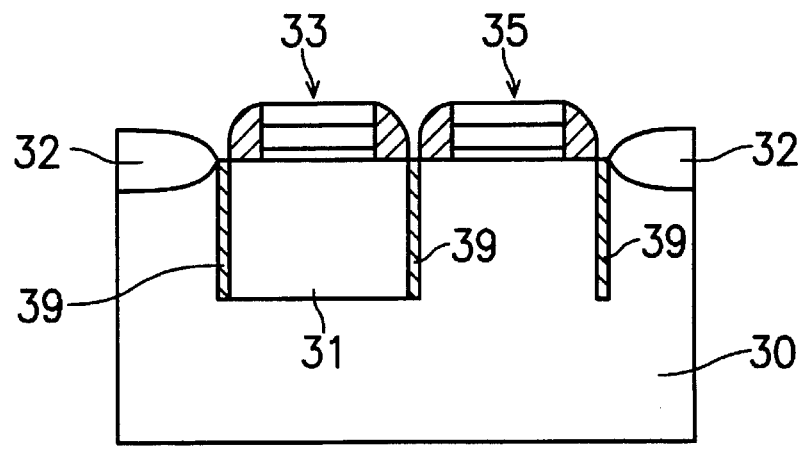

Referring to FIG. 3E, using thermal oxidation or chemical vapor deposition (CVD), trenches 37 are refilled with an oxide layer 39 and etched back. Then the spacers 42 are removed.

Figure 3F:
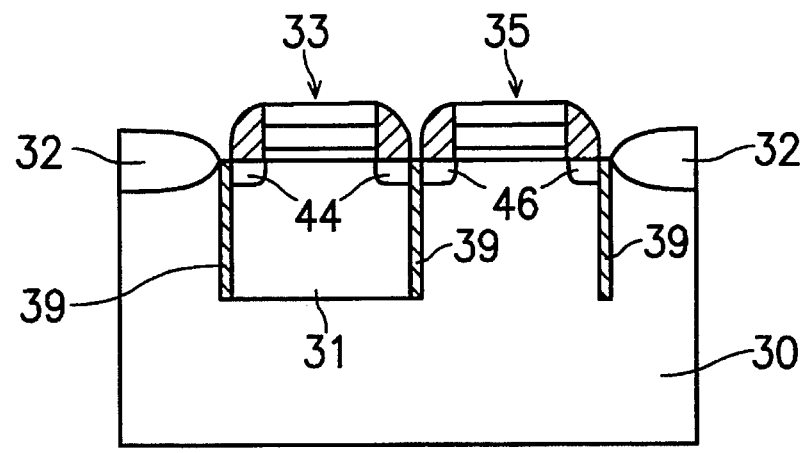

Finally referring to FIG. 3F, the N-well is coated by photoresist, and using the gate electrode 33 as a mask, P-type impurities are implanted to form source-drain electrodes 44, so that a PMOS structure is provided. Moreover, the PMOS structure is coated by photoresist, and using the gate 35 as a mask, N-type impurities are implanted to form source-drain electrodes 46, whereby an NMOS structure is provided. Deposition and a flow of boron phosphorus silicon glass (BPSG), a formation of a contact window, metallization, and a deposition of a passivation layer are performed in sequence, whereby the process of trench isolation in the CMOS transistor is completed. The above-mentioned PMOS or NMOS structures can be provided by a lightly doped drain (LDD) process.

According to the method of performing trench isolation in a CMOS transistor according to the invention, the following benefits can be obtained:

1. The isolation structure of the CMOS circuit between the PMOS and NMOS transistors is provided without using an epitaxial growth process, so that an uncontrolled rate of epitaxial growth is avoided and mass production becomes possible.
2. The trenches constructed by the process of the invention has the effect of preventing latch-up in the CMOS circuit.
3. The distance between source-drain electrodes and the edge of a well is reduced, thereby to facilitate higher integration of components.

It should be noted that although the preferred embodiment is illustrated by use of an N-well structure, the invention can be applied to other structures such as P-well structures, as will be understood by those skilled in the art.

While the invention has been described by way of example and in terms of a preferred embodiment, it is to be understood that the invention need not be limited to the disclosed embodiment. To the contrary, the scope of the invention is intended to include various modifications and similar arrangements within the spirit of the invention limited only by the appended claims, which should be accorded the broadest interpretation so as to encompass all such modifications and similar structures.

What is claimed is:

1. A method of producing trench isolation in a CMOS transistor, comprising the steps of:
   (a) forming a field oxide layer on a first conductivity-type silicon substrate to isolate an active region;
   (b) forming a second conductivity-type well at a position in the active region;
   (c) depositing on the active region a gate oxide layer, a polysilicon layer and a silicide layer in sequence, and forming first and second gate electrodes by lithography and etching wherein the first gate electrode is on a surface of the well, and the second gate electrode is on a surface of the active region outside of the well;
   (d) depositing an insulating layer and etching back, so as to form spacers on side walls of the first gate electrode and the second gate electrode, and so as to leave slits between the field oxide layer and the spacers, and between mutually adjacent spacers;
   (e) forming a plurality of trenches by etching the substrate in the slits;
   (f) forming an oxide layer to refill the trenches and then etching back so as to remove the spacers;
   (g) implanting first conductivity-type impurities in the well while using the first gate electrode as a mask, so as to provide first conductivity-type source-drain regions; and
   (h) implanting second conductivity-type impurities in the active region outside the well to provide second source-drain regions.

2. A method according to claim 1, wherein the first conductivity-type is P-type and the second conductivity-type is N-type.

3. A method according to claim 1, wherein the first conductivity-type is N-type and the second conductivity-type is P-type.

4. A method according to claim 1, wherein the polysilicon is deposited to a thickness of between about 2000 Å and about 3000 Å by low pressure chemical vapor deposition in said step c.

5. A method according to claim 1, wherein the silicide layer is a tungsten silicide and is deposited by low-pressure chemical vapor deposition in said step c.

6. A method according to claim 1, wherein the insulating layer deposited in said step d is a silicon nitride layer.

7. A method according to claim 1, wherein the spacers formed in said step d have a length between about 1 μm and about 3 μm.

8. A method according to claim 1, wherein the slit between mutually adjacent spacers is on the edge of the active region adjacent to the well.

9. A method according to claim 1, wherein the depth of the trenches formed in said step e is between about 2 μm and about 4 μm.

10. A method according to claim 1, wherein the oxide layer is formed in said step f by thermal oxidation.

11. A method according to claim 1, wherein the oxide layer is deposited in said step f by chemical vapor deposition.

12. A method of producing trench isolation in a CMOS transistor, comprising the steps of:

(a) forming a field oxide layer on a P-type silicon substrate to isolate an active region;

(b) forming an N-type well at a position in the active region;

(c) depositing on the active region a gate oxide layer, a polysilicon layer and a silicide layer in sequence; and forming the first and second gate electrodes by lithography and etching wherein the first gate electrode is on a surface of the well, and the second gate electrode is on a surface of the active region outside of the well;

(d) depositing a silicon nitride layer and etching back, so as to form spacers on side walls of the first gate electrode and the second gate electrode, and so as to leave slits between the field oxide layer and the spacers, and to leave a slit between the adjacent spacers on an edge of said active region adjacent to the well;

(e) forming a plurality trenches by etching the substrate in the slits between the field oxide layer and the spacers and between the adjacent spacers;

(f) forming an oxide layer to refill the trenches and then etching back so as to remove the spacers;

(g) implanting P-type impurities in the well while using the first gate electrode as a mask, so as to provide P-type source-drain regions, thereby to form a PMOS structure; and (h) implanting N-type impurities in the active region outside the well so as to provide N-type source-drain regions, thereby to form an NMOS structure.

13. A method according to claim 12, wherein the polysilicon is deposited in said step c to a thickness of between about 2000 Å and about 3000 Å by low-pressure chemical vapor deposition.

14. A method according to claim 12, wherein the silicide layer is a tungsten silicide layer and is deposited in said step c by low-pressure chemical vapor deposition.

15. A method according to claim 12, wherein the length of the spacers formed in said step d is between about 1 μm and about 3 μm.

16. A method according to claim 12, wherein the depth of the trenches formed in said step e is between about 2 μm and about 4 μm.

17. A method according to claim 12, wherein the oxide layer is formed in said step f by thermal oxidation.

18. A method according to claim 12, wherein the oxide layer is deposited in said step f by chemical vapor deposition.

* * * * *